(12) United States Patent
Vasilyev et al.

(10) Patent No.: US 7,852,486 B2
(45) Date of Patent: Dec. 14, 2010

(54) WAVELENGTH AND INTENSITY MONITORING OF OPTICAL CAVITY

(75) Inventors: Michael Vasilyev, Plano, TX (US); Nikolai Michael Stelmakh, Arlington, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 287 days.

(21) Appl. No.: 12/027,973

(22) Filed: Feb. 7, 2008

(65) Prior Publication Data

US 2009/0201959 A1 Aug. 13, 2009

(51) Int. Cl.
*G01B 9/02* (2006.01)
(52) U.S. Cl. .................. 356/484; 356/450; 372/50.21
(58) Field of Classification Search .............. 356/484, 356/450; 372/50.21
See application file for complete search history.

(56) References Cited

U.S. PATENT DOCUMENTS 5,684,586 A * 11/1997 Fortenberry et al. ........ 356/450

OTHER PUBLICATIONS

Stelmakh, Nikolai & Flowers, Max; "Measurement of Spatial Modes of Broad-Area Diode Lasers With 1-GHz Resolution Grating Spectrometer," IEEE Photonics Technology Letters, Aug. 1, 2006, pp. 1618-1620, vol. 18, No. 15, IEEE, U.S.A.

* cited by examiner

*Primary Examiner*—Minsun Harvey
*Assistant Examiner*—Michael Carter
(74) *Attorney, Agent, or Firm*—Chowdhury & Georgakis, P.C.

(57) ABSTRACT

According to various illustrative embodiments, a device, method, and system for measuring optical fine structure of lateral modes of an optical cavity are described. In one aspect, the device comprises at least one photodetector arranged to detect an output of the optical cavity in a lateral direction thereof. The device also comprises an analyzer coupled to an output of the at least one photodetector and arranged to analyze at least a portion of signals produced in the at least one photodetector by at least a portion of the lateral modes of the optical cavity. The device also comprises a processor arranged to determine the optical fine structure of the at least the portion of the lateral modes of the optical cavity based on an output of the analyzer.

29 Claims, 10 Drawing Sheets

WAVELENGTH AND INTENSITY MONITORING OF OPTICAL CAVITY

TECHNICAL FIELD OF THE PRESENT DISCLOSURE

The present disclosure relates generally to measuring optical properties of an optical cavity. More particularly, the present disclosure describes a device, method, and system useful for measuring optical fine structure of lateral modes of an optical cavity.

BACKGROUND OF THE PRESENT DISCLOSURE

Broad-area laser diodes are widely used today as various pump sources for fiber lasers and optically pumped solid state lasers. The efficient coupling between broad-area laser diodes and secondary gain media, such as fiber lasers and optically pumped solid state lasers, depends on the lateral mode structure (the mode structure in a direction transverse to the direction of emission) of the radiation in the optical cavity of the broad-area laser diode and the long-term stability of these lateral modes (the modes in the direction transverse to the emission direction). A precise knowledge of the relative intensity and wavelength of the lateral modes is useful to assure the optimum light delivery to the active medium.

A lateral mode intensity monitoring device based on conventional optical instruments such as gratings and interferometers requires an optical table and a significant amount of space. This is especially true for modern long-cavity broad-area laser diodes, where the longitudinal mode frequency difference (the difference in the frequency of modes in the direction of emission) becomes comparable to the intrinsic linewidth of the broad-area laser diode, in a range of from about 1 MHz to about 30 MHz. An alternative way of monitoring the lateral modes by coherent heterodyning (using coherent external optical sources at various frequencies to create beat frequencies) requires external optical sources that also require an optical table and a significant amount of space.

SUMMARY OF THE PRESENT DISCLOSURE

According to various illustrative embodiments, a device, method, and system for measuring optical fine structure of lateral modes of an optical cavity are described. In one aspect, the device comprises at least one photodetector arranged to detect an output of the optical cavity in a lateral direction thereof. The device also comprises an analyzer coupled to an output of the at least one photodetector and arranged to analyze at least a portion of signals produced in the at least one photodetector by at least a portion of the lateral modes of the optical cavity. The device also comprises a processor arranged to determine the optical fine structure of the at least the portion of the lateral modes of the optical cavity based on an output of the analyzer.

In various aspects, the device further comprises the analyzer comprising a radio frequency spectrum analyzer. In these devices, the signals comprise radio frequency beat frequencies. In various aspects, the device further comprises the analyzer comprising an oscilloscope. In these devices, the signals comprise time-domain signals corresponding to radio frequency beat frequencies.

In various aspects, the device further comprises the optical cavity being disposed in a broad-area laser diode. In various aspects, the device further comprises the optical cavity being disposed in a light-emitting diode. In various aspects, the device further comprises the at least one photodetector comprising an array of photodiodes. In various aspects, the device further comprises the at least one photodetector comprising an array of photodiodes disposed in a near-field domain of the optical cavity. In various aspects, the device further comprises the at least one photodetector comprising an array of photodiodes disposed in a far-field domain of the optical cavity.

In various aspects, the device further comprises the at least one photodetector comprising an array of photodiodes arranged to detect the output of the optical cavity in the lateral direction thereof by switching of the array of the photodiodes. In various aspects, the device further comprises the at least one photodetector comprising an array of photodiodes arranged to detect the output of the optical cavity in the lateral direction thereof by radio frequency switching of the array of the photodiodes. In various aspects, the device further comprises the at least one photodetector comprising an array of photodiodes arranged to detect the output of the optical cavity in the lateral direction thereof by self-heterodyning the array of the photodiodes. In various aspects, the device further comprises the at least one photodetector being arranged to detect the output of the optical cavity in the lateral direction thereof by using an array of movable mirrors. In various aspects, the device further comprises the processor being arranged to determine the optical fine structure comprising at least one of wavelength and intensity of the at least the portion of the lateral modes of the optical cavity.

In another aspect, a method for measuring optical fine structure of lateral modes of an optical cavity comprises detecting an output of the optical cavity in a lateral direction thereof using at least one photodetector. The method also comprises analyzing at least a portion of signals produced in the at least one photodetector by at least a portion of the lateral modes of the optical cavity using an analyzer coupled to an output of the at least one photodetector. The method also comprises determining the optical fine structure of the at least the portion of the lateral modes of the optical cavity based on an output of the analyzer using a processor.

In various aspects, the method further comprises the analyzer comprising a radio frequency spectrum analyzer. In these methods, the signals comprise radio frequency beat frequencies. In various aspects, the method further comprises the analyzer comprising an oscilloscope. In these methods, the signals comprise time-domain signals corresponding to radio frequency beat frequencies.

In various aspects, the method further comprises the optical cavity being disposed in one of a broad-area laser diode and a light-emitting diode. In various aspects, the method further comprises using the at least one photodetector further comprising using an array of photodiodes. In various aspects, the method further comprises using the at least one photodetector further comprising using an array of photodiodes disposed in a near-field domain of the optical cavity. In various aspects, the method further comprises using the at least one photodetector further comprising using an array of photodiodes disposed in a far-field domain of the optical cavity.

In various aspects, the method further comprises using the at least one photodetector further comprising using an array of photodiodes and detecting the output of the optical cavity in the lateral direction thereof further comprising switching of the array of the photodiodes. In various aspects, the method further comprises using the at least one photodetector further comprising using an array of photodiodes and detecting the output of the optical cavity in the lateral direction thereof further comprising radio frequency switching of the array of the photodiodes. In various aspects, the method further comprises using the at least one photodetector further comprising using an array of photodiodes and detecting the output of the optical cavity in the lateral direction thereof further comprising self-heterodyning the array of the photodiodes. In various aspects, the method further comprises using the at least one photodetector further comprising using an array of movable mirrors. In various aspects, the method further comprises determining the optical fine structure of the at least the portion of the lateral modes of the optical cavity further comprising determining at least one of wavelength and intensity of the at least the portion of the lateral modes of the optical cavity.

In yet another aspect, a system for measuring optical fine structure of lateral modes of an optical cavity is provided, the system comprising an array of isolated contacts comprising saturable absorbers laterally disposed on the optical cavity at an end portion thereof, the array of the isolated contacts arranged to detect an output of the optical cavity in a lateral direction thereof using a first radio frequency switch. The system also comprises a radio frequency spectrum analyzer coupled to an output of the array of the isolated contacts and arranged to analyze at least a portion of radio frequency beat frequencies produced in the array of the isolated contacts by at least a portion of the lateral modes of the optical cavity. The system also comprises a processor arranged to determine the optical fine structure of the at least the portion of the lateral modes of the optical cavity based on an output of the radio frequency spectrum analyzer and to provide mode-stabilization retroactive feedback to the array of the isolated contacts using a second radio frequency switch.

BRIEF DESCRIPTION OF THE DRAWINGS

The following figures form part of the present specification and are included to further demonstrate certain aspects of the present claimed subject matter, and should not be used to limit or define the present claimed subject matter. The present claimed subject matter may be better understood by reference to one or more of these drawings in combination with the description of embodiments presented herein. Consequently, a more complete understanding of the present embodiments and further features and advantages thereof may be acquired by referring to the following description taken in conjunction with the accompanying drawings, in which the leftmost significant digit(s) in the reference numerals denote(s) the first figure in which the respective reference numerals appear, wherein:

Figure 1:
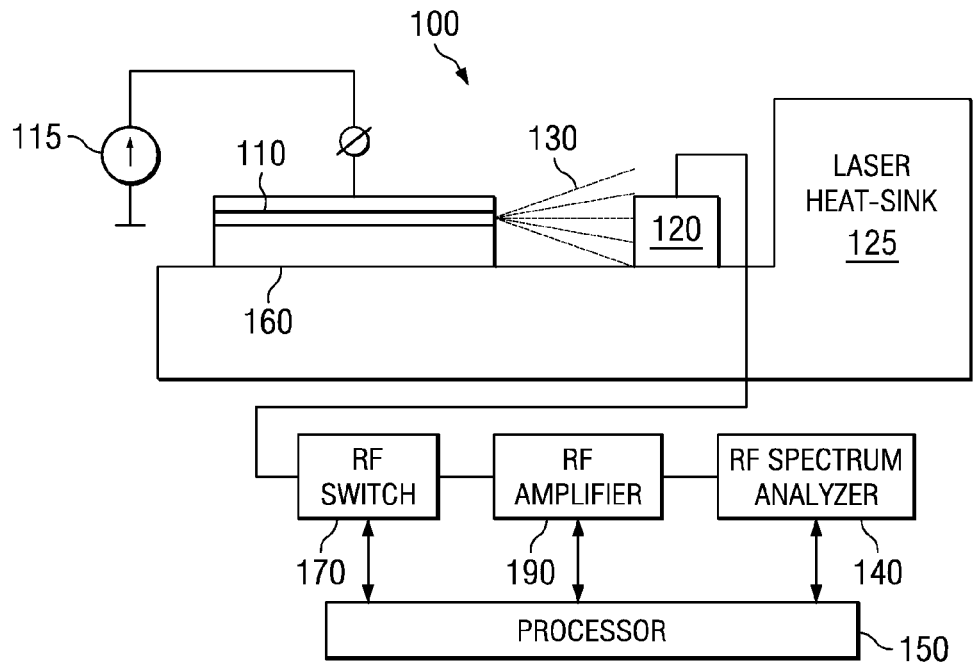
FIG. 1 schematically illustrates a particular example of various illustrative embodiments of a device in accord with the present disclosure.

It is to be noted, however, that the appended drawings illustrate only typical embodiments of the present claimed subject matter and are, therefore, not to be considered limiting of the scope of the present claimed subject matter, as the present claimed subject matter may admit to other equally effective embodiments.

NOTATION AND NOMENCLATURE

Certain terms are used throughout the following description and claims to refer to particular system components and configurations. As one skilled in the art having the benefit of the present disclosure will appreciate, companies may refer to a component by different names. This document does not intend to distinguish between components that differ in name but not function. In the following discussion and in the claims, the terms "including" and "comprising" are used in an open-ended fashion, and, thus, should be interpreted to mean "including, but not limited to . . . ," and so forth. Also, the term "couple" or "couples" is intended to mean either an indirect or direct connection. Thus, if a first device or component couples to a second device or component, that connection may be through a direct connection or through an indirect connection via other devices and/or components and/or connections. Furthermore, the term "information" is intended to refer to any data, instructions, or control sequences that may be communicated between components of a device. For example, if information is sent between two components, data, instructions, control sequences, or any combination thereof may be sent between the two components.

DETAILED DESCRIPTION OF ILLUSTRATIVE EMBODIMENTS

Illustrative embodiments of the present claimed subject matter are described in detail below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of the present disclosure.

In various illustrative embodiments, as shown in FIG. 1, FIG. 2A, FIG. 2B, FIG. 2C, FIG. 3, and FIG. 5, for example, a device 100 for measuring optical fine structure of lateral modes of an optical cavity 110 may be provided. The optical cavity 110 may comprise an active medium with a refractive index $n_{ph}(\lambda)$ that may depend on the wavelength $\lambda$ of a broad-area laser diode 160, for example. The optical cavity 110 may have a length L in the longitudinal direction, as shown at 510, a width W in a lateral direction 210, and a thickness d in the vertical direction, as shown at 520. The optical cavity 110 may emit an output 130 in the forward direction and an output 530 in a reverse direction. The optical cavity 110 may be aligned along x, y, and z axes as shown at 540.

The device 100 may comprise at least one photodetector 120 arranged to detect an output 130 of the optical cavity 110 in the lateral direction 210 thereof. Examples of suitable photodetectors 120 may include the PDU-V104 made by Advanced Photonix, the S1133-01 made by Hamamatsu, and an array of about 16 diodes (PDB-C216-ND) made by Advanced Photonix.

The device 100 may also comprise an analyzer 140, such as a radio frequency spectrum analyzer 140, coupled to an output of the one or more photodetectors 120. The analyzer 140 may be arranged to analyze at least a portion of signals, such as radio frequency beat frequencies, produced in the one or more photodetectors 120 by at least a portion of the lateral modes of the optical cavity 110. For example, the radio frequency spectrum analyzer 140 may be arranged to analyze at least a portion of radio frequency beat frequencies produced in the one or more photodetectors 120 by at least a portion of the lateral modes of the optical cavity 110. Examples of suitable radio frequency spectrum analyzers 140 may include the 8563EC Portable Spectrum Analyzer made by Agilent Technologies and the RSA6100 Series High Performance Real-Time Spectrum Analyzer made by Tektronix.

The device 100 may also comprise a processor 150 arranged to determine the optical fine structure of at least the portion of the lateral modes of the optical cavity 110 based on an output of the analyzer 140. For example, the processor 150 may be arranged to determine the optical fine structure of at least the portion of the lateral modes of the optical cavity 110 based on an output of the radio frequency spectrum analyzer 140. Examples of suitable processors 150 may include a Dell PC with a general purpose interface bus (GPIB) card made by National Instruments and an Apple Macintosh with a GPIB card made by National Instruments.

Figure 2A:
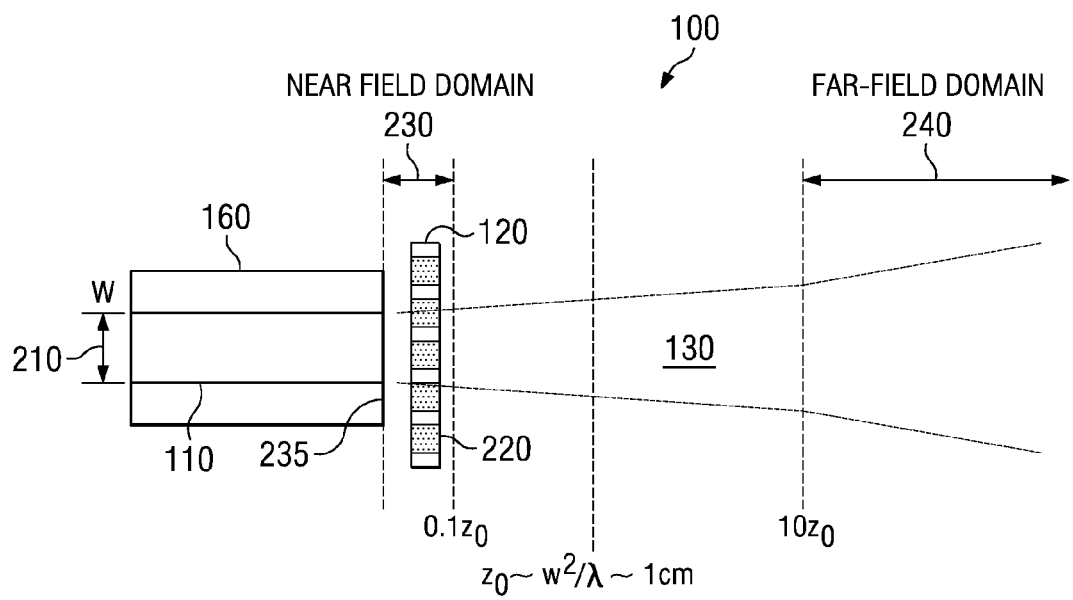
FIGS. 2A-2C schematically illustrate particular examples of various illustrative embodiments of devices in accord with the present disclosure.
Figure 2B:
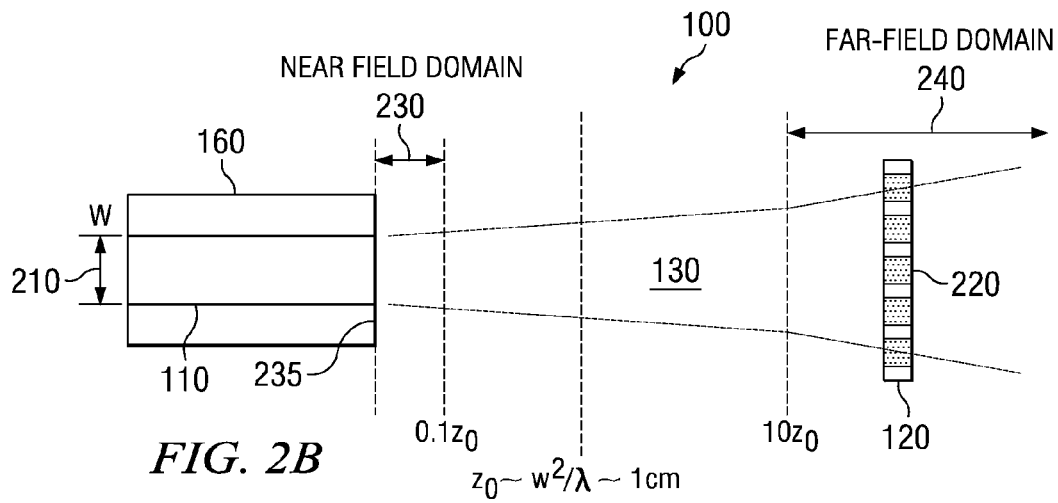
Figure 2C:
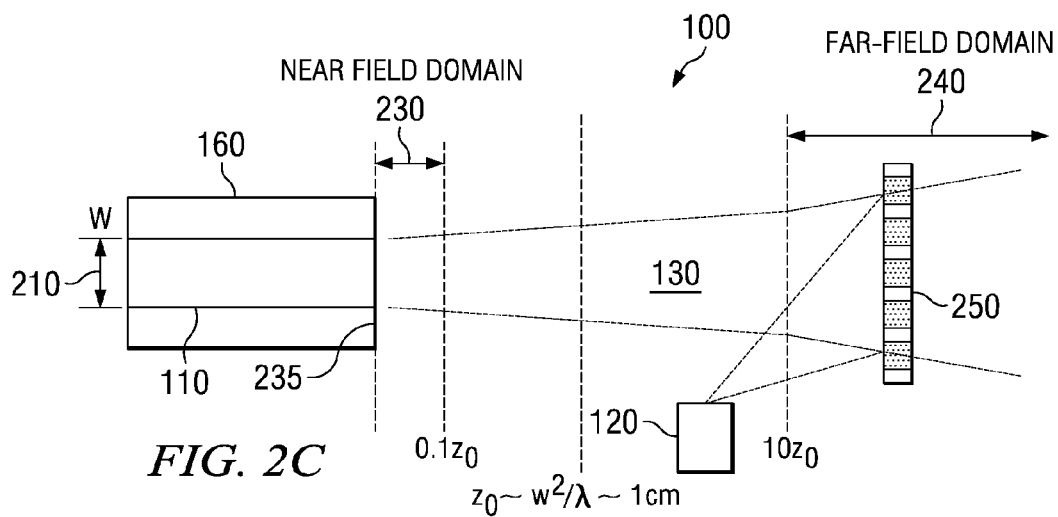
Figure 3:
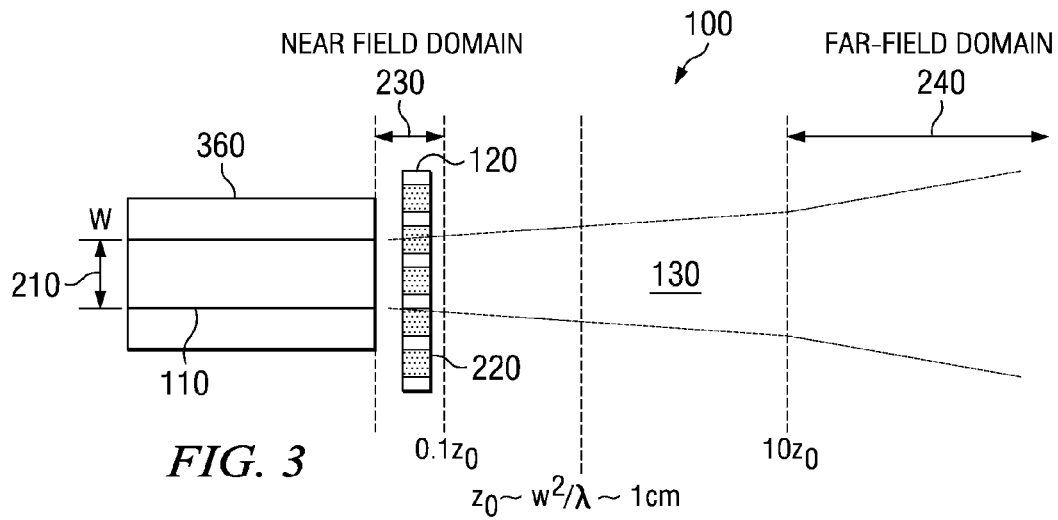
FIG. 3 schematically illustrates a particular example of various illustrative embodiments of another device in accord with the present disclosure.

As shown in FIG. 1, FIG. 2A, FIG. 2B, FIG. 2C, and FIG. 4A, for example, in various illustrative embodiments, the optical cavity 110 may be disposed in a broad-area laser diode 160. In various illustrative embodiments, as shown in FIG. 3, for example, the optical cavity 110 may be disposed in a light-emitting diode 360.

In various illustrative embodiments, the one or more photodetectors 120 may comprise an array of photodiodes 220. For example, in various illustrative embodiments, the one or more photodetectors 120 may comprise an array of fast photodiodes 220, where each of the component fast photodiodes may have a bandwidth of about 1 GHz. In various illustrative embodiments, the one or more photodetectors 120 may comprise an array of fast photodiodes 220 disposed in a near-field domain 230 of the optical cavity 110, as shown in FIG. 2A and FIG. 3, for example. As shown in FIG. 2B, for example, in various illustrative embodiments, the one or more photodetectors 120 may comprise an array of fast photodiodes 220 disposed in a far-field domain 240 of the optical cavity 110. The near-field domain 230 of the optical cavity 110 and the far-field domain 240 of the optical cavity 110 may be defined relative to the Rayleigh length $z_0 \equiv W^2/\lambda$ of the optical cavity 110, where W is the width of the optical cavity 110 in the lateral direction 210 thereof and $\lambda$ is the wavelength of the light emitted or output 130 by the optical cavity 110. For example, for $W \approx 100$ μm and $\lambda \approx 1$ μm, the Rayleigh length $z_0 \approx 10000$ μm=1 cm. The near-field domain 230 of the optical cavity 110 may be defined to be the set of points that are equal to or less than about 0.1 $z_0$ in the longitudinal z direction (see 540 in FIG. 5) from a longitudinal end 235 of the optical cavity 110, as shown in FIG. 2A, for example. Note that the near-field domain 230 of the optical cavity 110 may extend into the interior of the optical cavity 110. Similarly, the far-field domain 240 of the optical cavity 110 may be defined to be the set of points that are equal to or more than about 10 $z_0$ in the longitudinal z direction (see 540 in FIG. 5) from the longitudinal end 235 of the optical cavity 110, as shown in FIG. 2A, for example.

The one or more photodetectors 120, in various illustrative embodiments, may comprise an array of fast photodiodes 220 arranged to detect the output 130 of the optical cavity 110 in the lateral direction 210 thereof by radio frequency switching 170 of the array of the fast photodiodes 220. Radio frequency switching may involve switching between various of the fast photodiodes in the array of the fast photodiodes 220 at radio frequencies using one or more radio frequency switches 170, for example. Examples of suitable radio frequency switches 170 may include the NJG1617K11 made by NJR Corporation, the ADG901 made by Analog Devices, and the SRS3019 made by Cougar Technologies.

In various illustrative embodiments, the one or more photodetectors 120 may comprise an array of fast photodiodes 220 arranged to detect the output 130 of the optical cavity 110 in the lateral direction 210 thereof by self-heterodyning of the array of the fast photodiodes 220. Self-heterodyning of the array of the fast photodiodes 220 may involve various of the lateral modes interfering with each other in each of the fast photodiodes of the array of the fast photodiodes 220 to produce radio frequency beat frequencies therein.

The one or more photodetectors 120, in various illustrative embodiments, may be arranged to detect the output 130 of the optical cavity 110 in the lateral direction 210 thereof by using an array of movable mirrors 250. For example, the array of movable mirrors 250 may comprise an array of microelectricalmechanical system (MEMS) mirrors suitably controlled by the processor 150 to reflect appropriate portions of the output 130 of the optical cavity 110 in the lateral direction 210 thereof selectively into the one or more photodetectors 120, as shown in FIG. 2C, for example. Examples of suitable arrays of movable mirrors 250 may include digital light processing (DLP) arrays made by Texas Instruments and 1×128 mirror arrays made by Advanced Micro Devices (AMD).

In various illustrative embodiments, the processor 150 may be arranged to determine the optical fine structure comprising wavelength position and/or lateral mode intensity of at least the portion of the lateral modes of the optical cavity 110. Based on the output of the radio frequency spectrum analyzer 140, the processor 150 may be arranged to determine the individual lateral mode intensity and/or wavelength position, as described in more detail below.

Figure 4A:
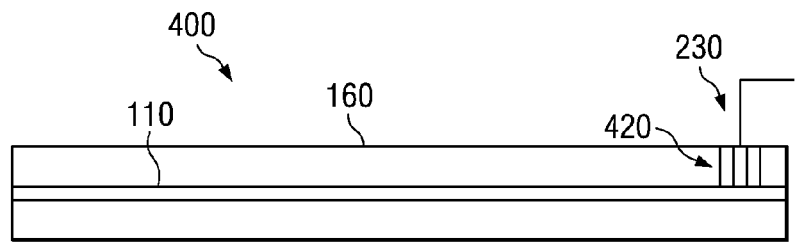
FIGS. 4A-4B schematically illustrate a side view and a top view, respectively, of a particular example of various illustrative embodiments of a system in accord with the present disclosure.
Figure 4B:
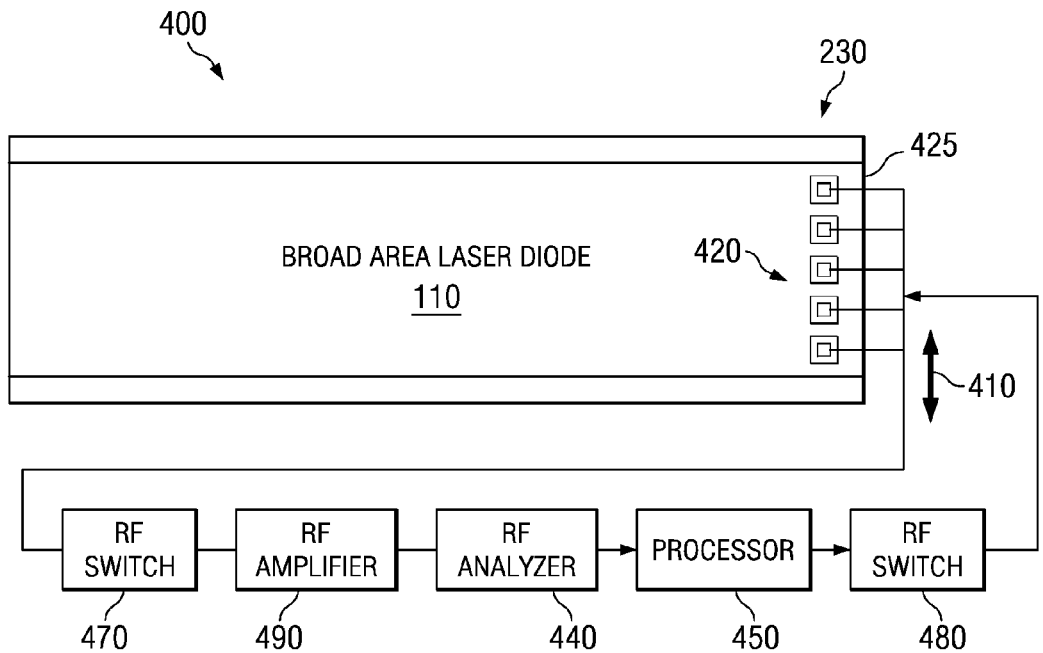

As shown in FIG. 4A and FIG. 4B, for example, in various illustrative embodiments, a system 400 for measuring optical fine structure of lateral modes of an optical cavity 110 may comprise an array of isolated contacts 420. The array of isolated contacts 420 may comprise saturable absorbers laterally disposed on the optical cavity 110 at an end portion 425 thereof. The array of the isolated contacts 420 may be arranged to detect an output 130 of the optical cavity 110 in a lateral direction 410 thereof using a first radio frequency switch 470. The system 400 may also comprise a radio frequency spectrum analyzer 440 coupled to an output of the array of the isolated contacts 420. The radio frequency spectrum analyzer 440 may be arranged to analyze at least a portion of radio frequency beat frequencies produced in the array of the isolated contacts 420 by at least a portion of the lateral modes of the optical cavity 110. The system 400 may also comprise a processor 450 arranged to determine the optical fine structure of at least the portion of the lateral modes of the optical cavity 110 based on an output of the radio frequency spectrum analyzer 440. The processor 450 may also be arranged to provide mode-stabilization retroactive feedback to the array of the isolated contacts 420 using a second radio frequency switch 480. The array of the isolated contacts 420 may be the functional equivalent of the one or more fast photodetectors 120 and/or fast modulators described in various other illustrative embodiments herein.

In various illustrative embodiments, the radio frequency (RF) spectra of the broad-area laser diode (BALD) 160 may be measured using the apparatus 100, as shown in FIG. 1 and FIG. 2A, for example, as described above. The photodetector 120 may comprise the array of fast photodiodes 220, where each of the fast photodiodes 220 may have a relatively small diameter and a bandwidth of about 1 GHz. Since the modes may have slightly different frequencies, the resulting intensity of the superimposed modes may oscillate with differential (beat) frequencies. These intensity oscillations may be detected by the fast photodiodes 220, amplified by the radio frequency (RF) amplifier 190 and delivered to the radio frequency (RF) spectrum analyzer 140. Since the array of the fast photodiodes 220 is disposed along the lateral direction 210 of an output facet of the optical cavity 110 of the broad-area laser diode (BALD) 160, using the radio frequency (RF) switch 170, the radio frequency (RF) spectra may be measured for different lateral coordinates x, as indicated at 540. Variations of the intensity and phase of each lateral mode field create significant alterations of the radio frequency (RF) spectra, and these variations help significantly enhance the reliability of beat frequency identification and precise measurement of the intensity of the beat frequencies. The radio frequency (RF) spectrum acquisition and analysis may be suitably synchronized by the processor 150.

In various illustrative embodiments, the optical fine structure of broad-area laser diode (BALD) optical spectra may be measured using the optical heterodyning phenomenon (production of radio frequency beat frequencies) between lateral modes. The lateral mode beat frequencies may be detected with a fast photodetector 120 in the radio frequency (RF) domain by a high-sensitivity radio frequency (RF) spectrum analyzer 140. The corresponding frequency signal may be measured with suitable spatial resolution in either the near-field domain 230 or the far-field domain 240. The resulting analysis and processing fully identifies the lateral mode intensities and wavelengths with a frequency resolution limited only by the intrinsic linewidth of the broad-area laser diode (BALD) 160, which intrinsic linewidth is in a range of from about 1 MHz to about 30 MHz.

Figure 5:
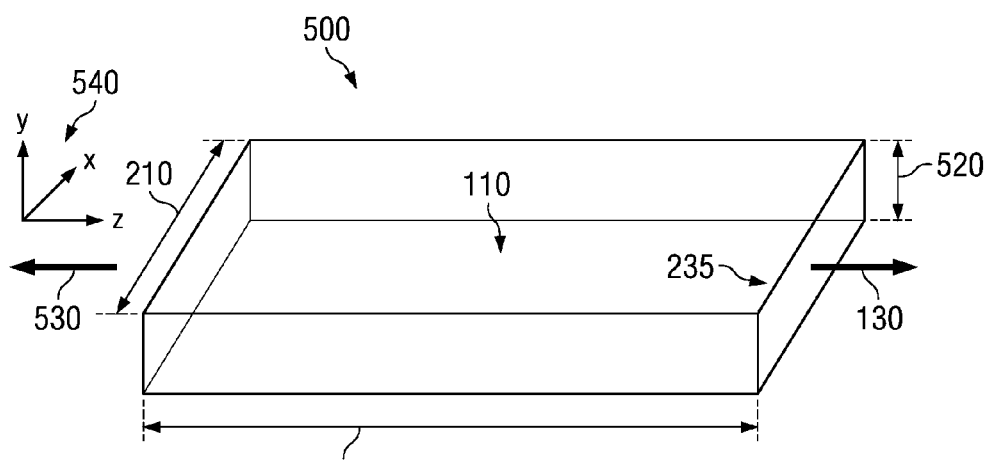
FIG. 5 schematically illustrates dimensions of an optical cavity in accord with the present disclosure.

In various illustrative embodiments, as shown, for example, in FIG. 1, and at 500 in FIG. 5, the optical cavity 110 may be disposed in the broad-area laser diode 160. As described above, the optical cavity 110 may comprise an active medium with a refractive index $n_{ph}(\lambda)$ that may depend on the wavelength $\lambda$ of the broad-area laser diode 160. The optical cavity 110 may have the length L in the longitudinal direction, as shown at 510, the width W in the lateral direction 210, and the thickness d in the vertical direction, as shown at 520. The optical cavity 110 may emit the output 130 in the forward direction and the output 530 in a reverse direction. The optical cavity 110 may be aligned along x, y, and z axes as shown at 540. Reflections of the walls of the optical cavity 110 may put restrictions on the k-vector (the wave number vector) of the plane wave propagating inside the optical cavity 110. Assuming that the thickness d in the vertical direction 520 of the optical cavity 110 may be less than the wavelength $\lambda$ and that a longitudinal mode index m (an integer) is much, much greater than 1, the k-vector in the x-z plane may be expressed as follows:

$$\vec{k} = k_x \vec{x} + k_z \vec{z} \propto 2\pi n_{ph}\left(\frac{p}{W}\vec{x} + \frac{m}{L}\vec{z}\right),$$

where the lateral mode index is p (also an integer) and $\vec{x}, \vec{z}$ are unit vectors in the x and z directions, respectively. These restrictions on the k-vector stabilize the modes at specific wavelengths, which may be classified by the longitudinal mode index m and the lateral mode index p according to the following:

$$\lambda_{m,p} = 2n_{ph}(\lambda) \bigg/ \sqrt{\frac{m^2}{L^2} + \frac{p^2}{W^2}}.$$

Figure 6:
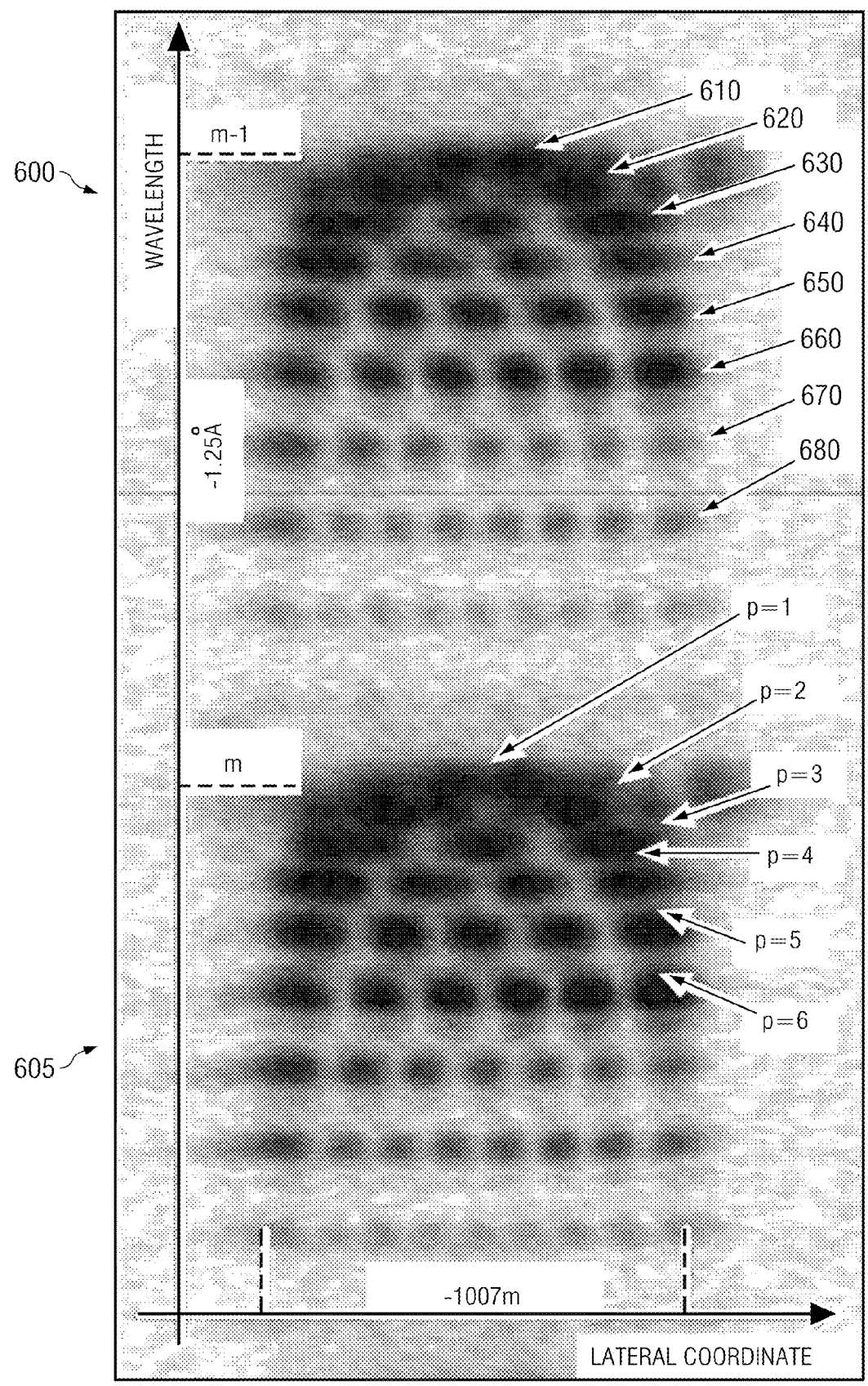
FIG. 6 schematically illustrates near-field spectra of two longitudinal mode intervals in accord with the present disclosure.

In the limit that the lateral mode index p goes to 0, giving a laterally single-mode laser diode, $\lambda_{m,p}$ reduces to $$\lambda_{m,0} = 2n_{ph}(\lambda) \bigg/ \sqrt{\frac{m^2}{L^2}} = 2n_{ph}(\lambda)L/m$$

and, in terms of frequency, $$v_{m,0} = \frac{c}{2Ln_{ph}(\lambda)}m,$$

where c is the speed of light. FIG. 6 shows, for example, near-field optical spectra of two longitudinal mode intervals 600 and 605, corresponding to longitudinal mode indices (m−1) and m, respectively. The wavelength distance between the mode groups may be about 1.25 Angstroms (1.25 Å). Each mode group has a fundamental mode 610 with one intensity peak at the longest wavelength and the higher order modes 620, 630, 640, 650, 660, 670, 680 (indexed with p>1) having a number of peaks equal to the lateral mode index p, respectively. These higher order modes 620, 630, 640, 650, 660, 670, 680 are placed progressively on the short wavelength side of the fundamental mode 610 line. FIG. 6 shows, for example, the spatially-resolved spectrum of a broad-area laser diode (BALD) 160 that may have an optical cavity 110 with length L=1008 µm and width W=100 µm that fits the formula for $\lambda_{m,p}$ given above. In FIG. 6, the lateral coordinate is given along the horizontal axis and wavelength is given along the vertical axis. Several types of broad-area laser diodes (BALDs) from different manufacturers, such as the HPD2010 made by HPD Incorporated and the AMC 976CW-02-251 made by Alfalight, have been tested. Up to the output intensity level of about 5 W per 100 µm stripe width, in the multimode regime, substantially all modes of semiconductor laser may have stable wavelength position and may be distinguishable in angle and/or wavelength.

The fields associated with the lateral and longitudinal modes of the broad-area laser diode (BALD) 160 may be described as follows. A co-sinusoidal function may provide a good qualitative description of the lateral spatial profile of the optical cavity 110 of the broad-area laser diode (BALD) 160. Using such a description, the fields associated with the lateral and longitudinal modes of the broad-area laser diode (BALD) 160 having a rectangular optical cavity 110 with width W and length L may be described in a simple way:

$$E_{m,p}(x, t) = \begin{cases} A_p \cos\left(\frac{\pi p x}{W}\right) \cos\left(2\pi \frac{c}{\lambda_{m,0}} t + \varphi_p\right), \ p \in 1 \\ A_p \sin\left(\frac{\pi p x}{W}\right) \cos\left(2\pi \frac{c}{\lambda_{m,0}} \left(1 + \frac{\lambda_{m,0}^2}{8 n_{ph}^2 W^2} p^2\right) t + \varphi_p\right), \ p \in 2,4,6, \ldots \\ A_p \cos\left(\frac{\pi p x}{W}\right) \cos\left(2\pi \frac{c}{\lambda_{m,0}} \left(1 + \frac{\lambda_{m,0}^2}{8 n_{ph}^2 W^2} p^2\right) t + \varphi_p\right), \ p \in 3,5,7, \ldots \end{cases}$$

where $\lambda_{m,0}$ is the wavelength of a fundamental longitudinal mode, as given above by the expression $\lambda_{m,0}=2 L n_{ph}(\lambda)/m$, and where m is the longitudinal mode index, p is the lateral mode index, L is the longitudinal dimension 510 of the laser optical cavity 110, W is the lateral dimension 210 of the laser optical cavity 110, $n_{ph}(\lambda)$ is the phase refractive index, $\phi_p$ is a random phase, c is the speed of light, $A_p$ is the mode amplitude, x is the lateral coordinate, as shown at 540, and t is the time coordinate.

Each lateral and longitudinal mode has a specific wavelength defined by $$\lambda_{m,p} = 2 n_{ph}(\lambda) / \sqrt{\frac{m^2}{L^2} + \frac{p^2}{W^2}}.$$

Experiments have shown that such a description remains acceptable up to the laser power levels that are close to catastrophic degradation of the laser.

Those of ordinary skill in this art, having the benefit of the present disclosure, would appreciate the following technical detailed description. Technically, each mode has a specific net gain value that determines the mode's intensity value. The anti-guiding lateral confinement has higher losses for the higher-order lateral modes, and the total number of lateral modes may be limited and may be varying with current pumping conditions. Due to inhomogeneous gain depletion, the detailed calculations of the modal net gain and corresponding mode intensity may be quite complex and may be obtained from numerical analysis.

As these modes are incident on the photodetector 120, the fields of all the modes interfere. The total field may be found using the superposition principle:

$$E_{total}(x, t) = \sum_{m=1}^{\infty} \sum_{p=1}^{\infty} E_{m,p}(x, t),$$

where, due to the anti-guiding nature of the lateral confinement in broad-area laser diodes (BALDs) 160, the number of lateral modes may be infinite. However, due to the spectral profile of the gain, the angular losses of leaky modes, and spatial gain depletion, the light energy may be present in only a finite number P (typically in the range of about 10 to about 30) of lateral modes. Consequently, the double summation in $E_{total}(x,t)$ may be done over a narrow range of longitudinal indices m and lateral indices p. For example, at the pumping current level of about 3 to about 5 times threshold for the broad-area laser diode (BALD) 160, the laser diode emission may be concentrated in about 20 to about 30 longitudinal groups of about 5 to about 20 lateral modes that contain about 95% of the total output power.

Since all modes may have different frequencies and may be phase independent, the random phase term $\phi_p$ may be omitted in the beat frequency calculations. The photodetector 120 may generate electrons proportional to the instantaneous power arriving at the photodetector 120, in the limit of the radio frequency (RF) bandwidth of the photodetector 120. If the size of the photodetector 120 is smaller than about W/P, where W is the width of the optical cavity 110 and P is the total number of lateral modes, the mode orthogonality condition is equally broken for all modes. Consequently, the electronic signal from the photodetector 120 may be simply: $S(x,t) = (E_{total}(x,t))^2$. Due to the simplified form of $E_{m,p}(x,t)$ given above, S(x,t) may be calculated analytically, as described in more detail below.

In the case of radio frequency (RF) heterodyning spectra measured in the near-field optical domain 230, as shown in FIG. 2A, FIG. 3, FIG. 4A, and FIG. 4B, for example, it may be assumed that the frequency beats between any modes of different longitudinal groups will produce radio frequency (RF) frequencies out of the range of the photodetector 120 bandwidth, which may be about 10 GHz. In such a case, the summation over the longitudinal mode index m in the expression given above for $E_{total}(x,t)$ may be neglected and replaced by the averaged field amplitude at a central wavelength $\lambda_0$. The number of harmonics in the corresponding analytical expression may be proportional to the value of P(P−1)/2, where P is the total number of lateral modes. For example, if the broad-area laser diode (BALD) 160 emission contains 7 lateral modes, so that P=7, the radio frequency (RF) spectrum may contain 21 different frequencies. Several beating frequencies may be degenerate, so fewer than P(P−1)/2 different frequencies may be present in the radio frequency (RF) spectrum. A simplified and approximate trigonometric expression for the intensity and frequency of the radio frequency (RF) component, excluding the oscillating and zero terms and also neglecting frequency degeneration, may be given by:

$$S_P(x, t) = 2 \sum_{j=2}^{P} \sum_{k=1}^{j-1} S_j S_k \xi_{j,k} \cos(B\{t\})(\cos(C\{j - k, x\}) - \cos(C\{j + k, x\})),$$

where $B\{t\} \equiv \cos((j^2-(k')^2)\Delta\omega_t t)$, $$C\{j-k, x\} \equiv \cos\left((j-k)\Delta\omega_x x + \pi\frac{j-k}{2}\right),$$

and $$C\{j+k, x\} \equiv \cos\left((j+k)\Delta\omega_x x + \pi\frac{j+k}{2}\right),$$

$\xi_{j,k}$ is the sign modifier (insignificant for radio frequency analysis, which is phase insensitive), k' is the index that is equal to k except when k=1, in which case k'=0, and P is the total number of lateral modes. This expression for $S_p(x,t)$ shows the variation of the signal detected by the radio frequency (RF) analyzer (spectrometer) 140 as a function of the lateral coordinate x and the time t.

Figure 7A:
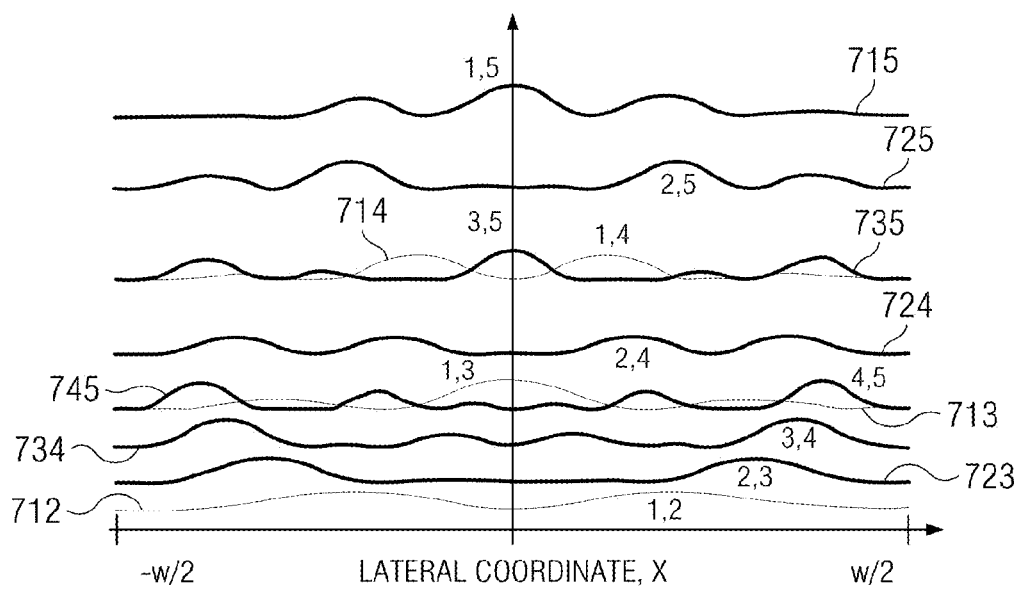
FIGS. 7A-7B schematically illustrate results of a numerical analysis, showing simulated pictures of spatially-resolved radio frequency (RF) spectra of the broad-area laser diode (BALD) in accord with the present disclosure.
Figure 7B:
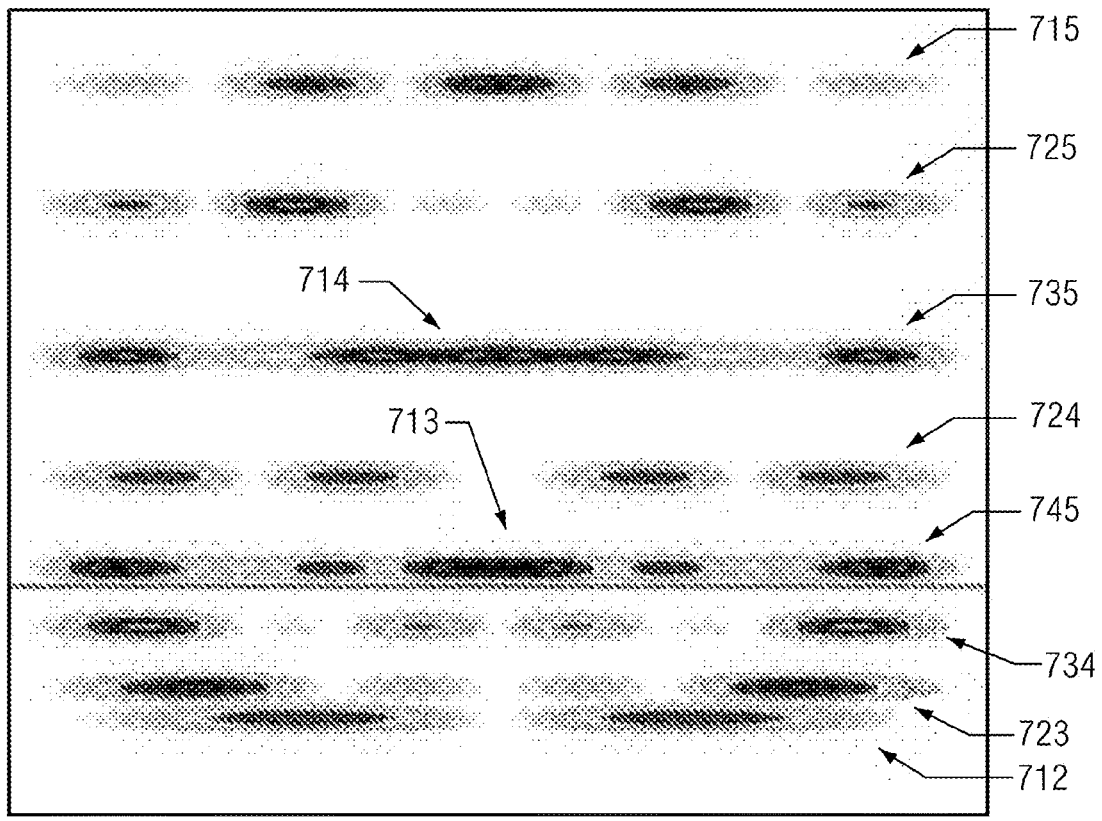

FIG. 7A and FIG. 7B, for example, show results of a numerical analysis, showing simulated pictures of spatially-resolved radio frequency (RF) spectra of the broad-area laser diode (BALD) 160. The lateral coordinate x may be plotted along the horizontal axis, ranging from (−W)/2 to W/2. Wavelength and intensity may be plotted along the vertical axis. FIG. 7A and FIG. 7B, for example, show spatial profiles of radio frequency (RF) power corresponding to mode beat frequencies. The total number of lateral modes involved here is P=5. The corresponding number of resulting beat frequencies is P(P−1)/2=5(4)/2=10. The beat frequency 712 with real mode intensity $S_{1,2}$ results from interference between the lateral mode with p=1 and the lateral mode with p=2. The beat frequency 713 with real mode intensity $S_{1,3}$ results from interference between the lateral mode with p=1 and the lateral mode with p=3. The beat frequency 714 with real mode intensity $S_{1,4}$ results from interference between the lateral mode with p=1 and the lateral mode with p=4. The beat frequency 715 with real mode intensity $S_{1,5}$ results from interference between the lateral mode with p=1 and the lateral mode with p=5. The beat frequency 723 with real mode intensity $S_{2,3}$ results from interference between the lateral mode with p=2 and the lateral mode with p=3. The beat frequency 724 with real mode intensity $S_{2,4}$ results from interference between the lateral mode with p=2 and the lateral mode with p=4. The beat frequency 725 with real mode intensity $S_{2,5}$ results from interference between the lateral mode with p=2 and the lateral mode with p=5. The beat frequency 734 with real mode intensity $S_{3,4}$ results from interference between the lateral mode with p=3 and the lateral mode with p=4. The beat frequency 735 with real mode intensity $S_{3,5}$ results from interference between the lateral mode with p=3 and the lateral mode with p=5. The beat frequency 745 with real mode intensity $S_{4,5}$ results from interference between the lateral mode with p=4 and the lateral mode with p=5. In general, the beat frequency with real mode intensity $S_{j,k}$ results from interference between the lateral mode with p=j and the lateral mode with p=k, where j<k. Due to mode frequency coincidence (degeneration), there may be only about 8 beat frequencies readily visible in the radio frequency (RF) two-dimensional (2-D) spectral simulation shown in FIG. 7B, for example.

In various illustrative embodiments, mode intensity and wavelength position may be recovered from near-field radio frequency (RF) spectra. When the number of lateral modes is less than several tens, a procedure may be developed to recover the initial optical intensity of the modes and the wavelength position of the modes. For example, the transformation rules from real mode intensity $S_{j,k}$ to radio frequency (RF) signal amplitudes $A_j$ and $A_k$ may be summarized by a matrix of equations:

$$\begin{cases} A_1A_2 = S_{1,1} & A_1A_2 = S_{1,2} & \ldots & A_1A_{n-1} = S_{1,n-1} & A_1A_n = S_{1,n} \\ \ldots & A_2A_2 = S_{2,2} & \ldots & A_2A_{n-1} = S_{2,n-1} & A_2A_n = S_{1,n} \\ \vdots & \vdots & \ddots & \vdots & \vdots \\ \ldots & \ldots & \ldots & A_{n-1}A_{n-1} = S_{n-1,n-1} & A_{n-1}A_n = S_{n-1,n} \\ \ldots & \ldots & \ldots & \ldots & A_nA_n = S_{n,n} \end{cases}$$

where the sum $$\sum_{n=1}^{P} S_{n,n} = S_0$$

represents the DC value of intensity. This system of equations may be over-determined and may be solved by the optimization of the mean square error. However, in the case of high quality radio frequency (RF) detection, a visual selection of n radio frequency (RF) lines in the radio frequency (RF) spectrum may be made, followed by an algebraic solution of the n equation system for n variables. The variables $A_n$ may be uniquely determined from the equations for $S_{n-1,n}$ and the equation for $S_{n-2,n}$, which is the equation for $S_{1,3}$ in the simplest case. For example, $A_{n-2}A_{n-1}=S_{n-2,n-1}$ implies that $A_{n-1}=S_{n-2,n-1}/A_{n-2}$, and, similarly, $A_{n-1}A_n=S_{n-1,n}$ implies that $A_{n-1}=S_{n-1,n}/A_n$, so that $$A_{n-1}^2 = \frac{S_{n-2,n-1}S_{n-1,n}}{A_{n-2}A_n}.$$

However, $A_{n-2}A_n=S_{n-2,n}$, which gives the value of $A_{n-1}^2$ in terms of the known quantities $S_{n-2,n-1}$, $S_{n-1,n}$, and $S_{n-2,n}$. Once $A_{n-1}$ has been determined, $A_n$ and $A_{n-2}$ may be readily determined, along with $A_j$ for j=1 to j=n−3, given the equations for $S_{k-1,k}$ for k=2 to k=n−2. The wavelength position may be recovered using the relation:

$$\lambda_p = \Delta\lambda_{1p} + \lambda_0 = \frac{\lambda^2}{c}\Delta f_{1p} + \lambda_0.$$

In the case of a large number of lateral modes, the equation system may have hundreds of frequency components. The mode intensity and the wavelength recovery process from radio frequency (RF) spectra measured in the near-field domain 230 may become challenging due to mode frequency degenerations and/or lateral mode interleaving.

As described above, in various illustrative embodiments, the radio frequency (RF) spectra of the broad-area laser diode (BALD) 160 may be measured using the apparatus 100, as shown in FIG. 1 and FIG. 2A, for example, as described above. The photodetector 120 may comprise the array of fast photodiodes 220, where each of the fast photodiodes 220 may have a relatively small diameter and a bandwidth of about 1 GHz. Since the modes may have slightly different frequencies, the resulting intensity of the superimposed modes may oscillate with differential (beat) frequencies. These intensity oscillations may be detected by the fast photodiodes 220, amplified by the radio frequency (RF) amplifier 190 and delivered to the radio frequency (RF) spectrum analyzer 140. Since the array of the fast photodiodes 220 is disposed along the lateral direction 210 of an output facet of the optical cavity 110 of the broad-area laser diode (BALD) 160, using the radio frequency (RF) switch 170, the radio frequency (RF) spectra may be measured for different lateral coordinates x, as indicated at 540. Variations of the intensity and phase of each lateral mode field create significant alterations of the radio frequency (RF) spectra, and these variations help significantly enhance the reliability of beat frequency identification and precise measurement of the intensity of the beat frequencies. The radio frequency (RF) spectrum acquisition and analysis may be suitably synchronized by the processor 150.

Figure 8A:
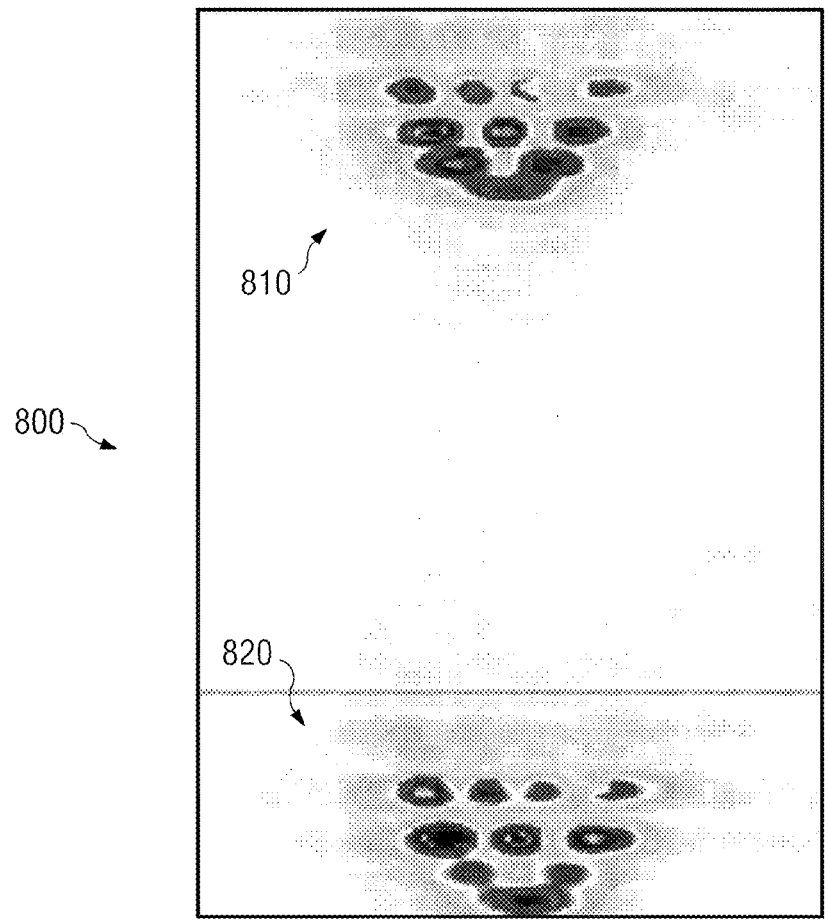
FIG. 8A schematically illustrates a high-resolution detail of the optical spectrum of a broad-area laser diode (BALD) in accord with the present disclosure.

FIG. 8A shows a high-resolution detail 800 of the optical spectrum of a broad-area laser diode (BALD) 160, having an optical cavity 110 with a longitudinal dimension 510 L=1 mm and a lateral dimension 210 W=96 μm. Laser spectra were measured using a pump current of about 300 mA and comprised about 19 to about 20 longitudinal mode groups spaced apart by a wavelength distance of about 1.2766 Å. FIG. 8A shows longitudinal mode group 810 and longitudinal mode group 820. The relative intensity of modes may be estimated from these reference measurements as $I_1=1$, $I_2=1.3$, $I_3=2.35$, $I_4=1.7$, and $I_5=0.32$. The relative mode frequency positions may be $f_0=0$ GHz, $f_1=1.49$ GHz, $f_2=3.53$ GHz, $f_3=5.88$ GHz, and $f_4=9.12$ GHz.

Figure 8B:
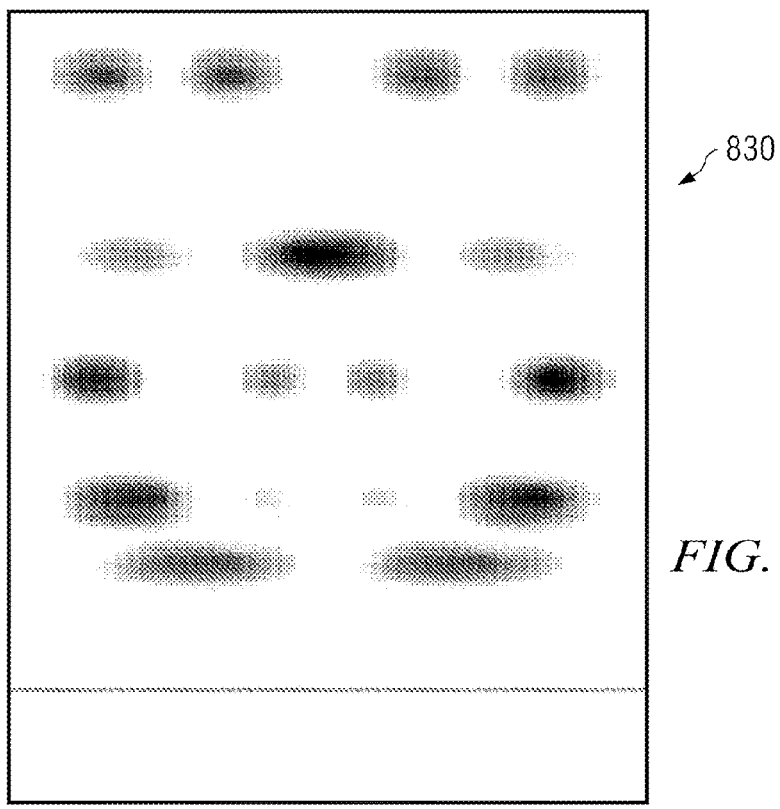
FIG. 8B schematically illustrates results of a radio frequency (RF) spectrum simulation of spatially resolved beat frequencies for the optical spectrum shown in FIG. 8A in accord with the present disclosure.
Figure 8C:
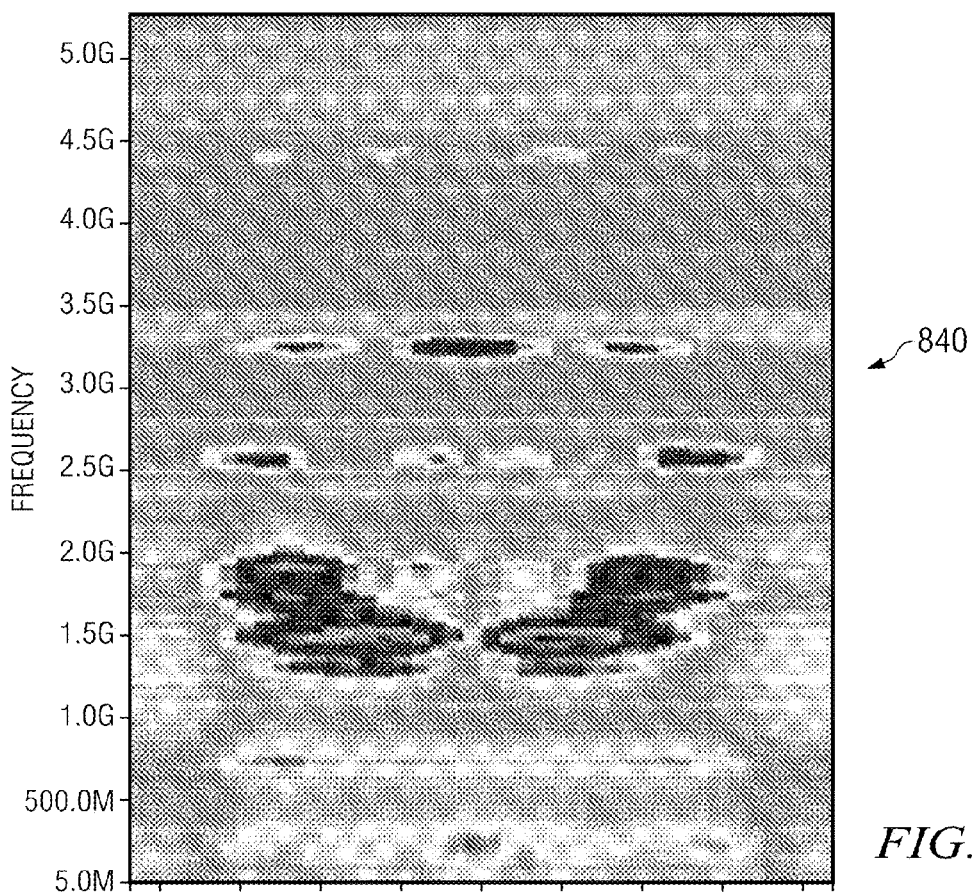
FIG. 8C schematically illustrates results of a radio frequency (RF) spectrum measurement of spatially resolved beat frequencies corresponding to the optical spectrum shown in FIG. 8A in accord with the present disclosure.

FIG. 8B shows results 830 of a radio frequency (RF) spectrum simulation of spatially resolved beat frequencies for the optical spectrum shown in FIG. 8A. FIG. 8C shows results 840 of a radio frequency (RF) spectrum measurement of spatially resolved beat frequencies corresponding to the optical spectrum shown in FIG. 8A. FIG. 8C shows the measured spatially resolved radio frequency (RF) spectrum of the broad-area laser diode (BALD) 160, having an optical cavity 110 with a longitudinal dimension 510 L=1 mm and a lateral dimension 210 W=96 μm, measured using the pump current of about 300 mA at a temperature T of about 20° C. The split of the peak corresponding to $S_{2,3}$ may be due to resonance phenomena in the detection circuit. These results 840 show that this measurement technique may be capable of measuring beat frequencies from broad-area laser diodes (BALDs) 160 with a spatial resolution of about 50 μm and with a spectral resolution of about 20 MHz to about 50 MHz. The bandwidth of the fast photodiodes 220 may be about 1 GHz, and the fast photodiodes 220 may be operated with a reverse voltage of about 3 Volts.

The modes shown in FIG. 8B and FIG. 8C may be readily recognizable and the recovery process of wavelength position may be relatively simple in this case. For example, the wavelength position may be recovered using the relation:

$$\lambda_p = \Delta\lambda_{1p} + \lambda_0 = \frac{\lambda^2}{c}\Delta f_{1p} + \lambda_0.$$

The radio frequency (RF) peaks have the following radio frequency (RF) positioning: $S_{1,2} \rightarrow 1.49$ GHz, $S_{2,3} \rightarrow 1.86$ GHz, $S_{3,4} \rightarrow 2.58$ GHz, $S_{1,3} \rightarrow 3.29$ GHz, and $S_{2,4} \rightarrow 4.47$ GHz, so that the averaged relative mode frequency positions may be $f_0 \rightarrow 0$ GHz, $f_1 \rightarrow 1.49$ GHz, $f_2 \rightarrow 3.32$ GHz, and $f_3 \rightarrow 5.92$ GHz. These values are in good agreement with those derived from the optical spectrum measurements shown in FIG. 8A, as described above.

Using the frequency curve of the fast photodiodes 220, the radio frequency (RF) peaks may have the following values: $S_{1,2} \rightarrow 400$, $S_{2,3} \rightarrow 900$, $S_{3,4} \rightarrow 1150$, and $S_{1,3} \rightarrow 680$. The system of equations to solve, as described above, becomes: $A_1A_2=S_{1,2}$, $A_2A_3=S_{2,3}$, $A_3A_4=S_{3,4}$, and $A_1A_3=S_{1,3}$, where the component $S_{4,5}$ is assumed to be negligible. The equation $A_1A_2=S_{1,2}$ may be rewritten as $A_2=S_{1,2}/A_1$ and the equation $A_2A_3=S_{2,3}$ implies that $A_2=S_{2,3}/A_3$ so that $(A_2)^2=(S_{1,2}S_{2,3})/(A_1A_3)=(S_{1,2}S_{2,3})/(S_{1,3})$, using $A_1A_3=S_{1,3}$ in the last step. Numerically, then $(A_2)^2=((400)(900))/(680)\approx 529=(23)^2$ so that $A_2=23$. Consequently, $$A_1 = S_{1,2}/A_2 = \frac{400}{23} \approx 17, A_3 = S_{2,3}/A_2 = \frac{900}{23} \approx 39,$$

and $$A_4 = S_{3,4}/A_3 = \frac{1150}{39} \approx 29.$$

These values are also in good agreement with the relative mode intensity reference data obtained optically, as may be seen from $$I_j = \frac{A_j}{A_1},$$

for j=1 to j=4, since $$I_1 = \frac{A_1}{A_1} = 1, I_2 = \frac{A_2}{A_1} = \frac{23}{17} \approx 1.35, I_3 = \frac{A_3}{A_1} = \frac{39}{17} \approx 2.29,$$

and $$I_4 = \frac{A_4}{A_1} = \frac{29}{17} \approx 1.71,$$

which agree well with the values given above for the optical relative mode intensity reference data, $I_1=1$, $I_2=1.3$, $I_3=2.35$, and $I_4=1.7$.

In the case of radio frequency (RF) heterodyning spectra measured in the far-field optical domain 240, as shown in FIG. 2B, and FIG. 2C, for example, the number of resulting beat frequencies may be reduced from P(P−1)/2 to (P−1), where P is the total number of lateral modes. This may occur by observing the radio frequency (RF) beats in the far-field plane where optical overlap of lateral modes only occurs between neighboring lateral modes. A corresponding simplified expression for the intensity and frequency of the radio frequency (RF) component, expressed as a function of the lateral wave number and time, may be given by:

$$S_P(k_x, t) =$$

-continued $$2\sum_{p=1}^{P} S_p \cos(((p+1)^2 - p^2)\Delta\omega_l t)\left(\frac{p(p+1)\sin(k_x W)}{(\pi^2 p^2 - k_x^2 W^2)(\pi^2 (p+1)^2 - k_x^2 W^2)}\right).$$

Figure 9A:
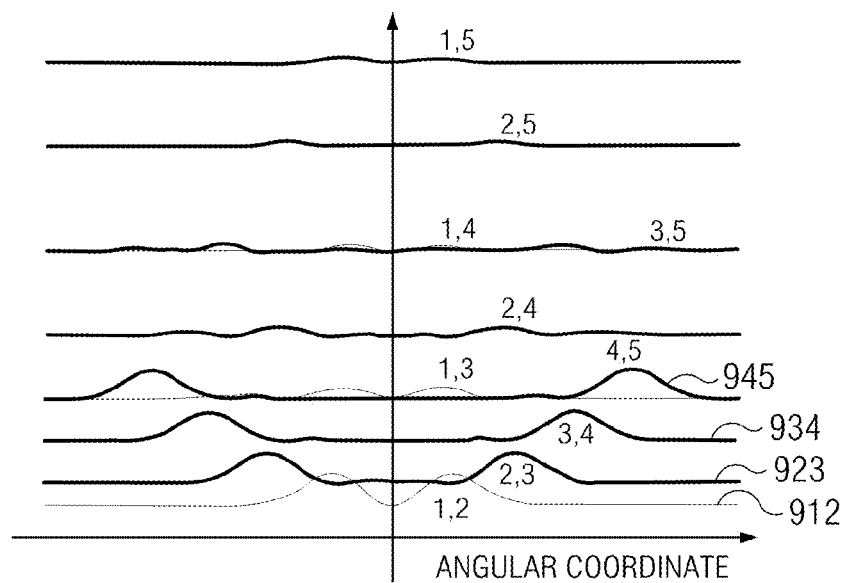
FIGS. 9A-9B schematically illustrate results of a numerical analysis, showing simulated pictures of angularly-resolved radio frequency (RF) spectra of the broad-area laser diode (BALD) in accord with the present disclosure.
Figure 9B:
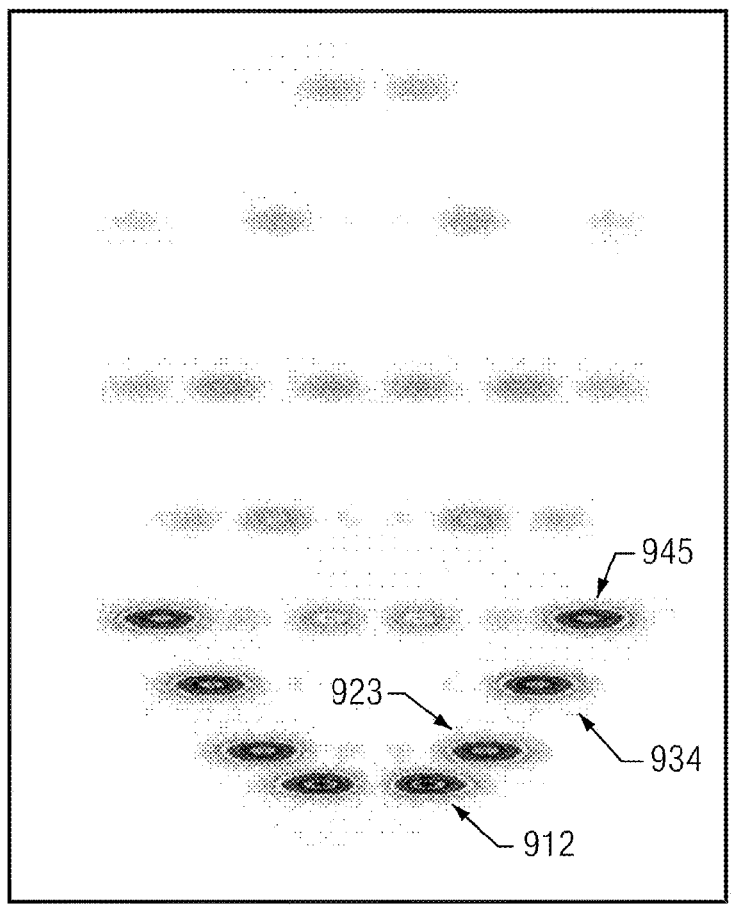

A numerical simulation of a similar formula taking into account the mode tail interactions is shown in FIG. 9A and FIG. 9B. The total number of lateral modes involved here is P=5. The corresponding number of resulting beat frequencies is (P−1)=4. The beat frequency 912 with real mode intensity $S_{1,2}$ results from interference between the lateral mode with p=1 and the lateral mode with p=2. The beat frequency 923 with real mode intensity $S_{2,3}$ results from interference between the lateral mode with p=2 and the lateral mode with p=3. The beat frequency 934 with real mode intensity $S_{3,4}$ results from interference between the lateral mode with p=3 and the lateral mode with p=4. The beat frequency 945 with real mode intensity $S_{4,5}$ results from interference between the lateral mode with p=4 and the lateral mode with p=5. In general, the beat frequency with real mode intensity $S_{j,k}$ results from interference between the lateral mode with p=j and the lateral mode with p=j+1. FIG. 9A and FIG. 9B show simulated pictures of angularly resolved radio frequency (RF) spectra of a broad-area laser diode (BALD) 160.

In various illustrative embodiments, mode intensity and wavelength position may be recovered from far-field radio frequency (RF) spectra. A procedure may be developed to recover the initial optical intensity of the modes and the wavelength position of the modes. For example, the transformation rules from real mode intensity $S_{j,j+1} \equiv S_j$ to radio frequency (RF) signal amplitudes $A_j$ and $A_{j+1}$ may be summarized by a matrix of equations:

$$\begin{cases} A_1 A_2 = S_{1,2} \equiv S_1 \\ A_2 A_3 = S_{2,3} \equiv S_2 \\ A_3 A_4 = S_{3,4} \equiv S_3 \\ \vdots \\ A_{n-1} A_n = S_{n-1,n} \equiv S_{n-1} \\ \sum_{n=1}^{P} A_n^2 = S_0 \end{cases},$$

where all unknown intensities of the system may be expressed through amplitude $A_1$ or the inverse of this amplitude $1/A_1$ multiplied by a suitable combination of the coefficients $S_j$. For example, $A_2=S_1/A_1$ and $A_3=S_2/A_2=(S_2A_1)/(S_1)$, and so forth. The sum $$\sum_{n=1}^{P} A_n^2 = S_0$$

then becomes a quadratic equation for $A_1^2$ that has two analytical solutions and it is possible to separate real and positive values for all mode intensities. One challenge of this method is the need to have a detector and a radio frequency (RF) analyzer with DC coupling. This challenge may be met by measuring the DC signal using a calibrated DC voltmeter. The measured DC voltage may be converted to a radio frequency (RF) analyzer spectral density amplitude by taking into account the mode line-width. Wavelength information may be determined by simple addition of the corresponding wavelength differences according to the following formula:

$$\lambda_p = \sum_{k=1}^{p-1} \Delta\lambda_k + \lambda_0 = \frac{\lambda^2}{c}\sum_{k=1}^{p-1} \Delta f_k + \lambda_0.$$

Both near-field and far-field radio frequency (RF) heterodyning may give substantially complete information about the mode intensity and wavelength of the optical cavity 110. In real laser diode structures, a linear dispersion of the refractive index may be present and may modify the cavity mode positions. The longitudinal free space interval (between successive longitudinal modes) particularly for long lasers may be very small, less than about 1 Å, for example. In such cases, many lateral modes may overlap in the near-field domain 230 and making measurements in the far-field domain 240 may be a more favorable technique for radio frequency (RF) spectroscopy in those cases. Substantially all deviations from the simplified models described herein may be easily monitored by radio frequency (RF) heterodyning.

At high current pumping levels the number of modes measured in the radio frequency (RF) spectra in the near-field domain 230 may increase and the overlap of the increased number of modes may make identification more challenging. The number of beating modes may be reduced with the addition of an optical spatial selector so that the beat frequency spectra may be measured in the far-field domain 240 with only the neighboring modes participating, as described above. Consequently, the radio frequency (RF) spectrum may show the frequency difference between neighboring modes as a function of the lateral mode index p and the total number of peaks present in the two-dimensional (2D) image may be significantly reduced.

In various illustrative embodiments, the radio frequency (RF) spectra of the broad-area laser diode (BALD) 160 may be measured using the apparatus 100, as shown in FIG. 1, FIG. 2B, and FIG. 2C, for example, as described above. In FIG. 2B, the photodetector 120 may comprise the array of fast photodiodes 220, where each of the fast photodiodes 220 may have a relatively small diameter and a bandwidth of about 1 GHz. Since the modes may have slightly different frequencies, the resulting intensity of the superimposed modes may oscillate with differential (beat) frequencies. These intensity oscillations may be detected by the fast photodiodes 220, amplified by the radio frequency (RF) amplifier 190 and delivered to the radio frequency (RF) spectrum analyzer 140. In FIG. 2B, the array of the fast photodiodes 220 is disposed along the lateral direction 210 of an output facet of the optical cavity 110 of the broad-area laser diode (BALD) 160. Consequently, using the radio frequency (RF) switch 170, the radio frequency (RF) spectra may be measured for different angular coordinates α, producing an angular scan of the radio frequency (RF) spectra of the broad-area laser diode (BALD) 160. Variations of the intensity and phase of each lateral mode field create significant alterations of the radio frequency (RF) spectra, and these variations help significantly enhance the reliability of beat frequency identification and precise measurement of the intensity of the beat frequencies. The radio frequency (RF) spectrum acquisition and analysis may be suitably arranged by the processor 150.

In FIG. 2C, the photodetector 120 may comprise a fast photodiode 220 that may have a relatively small diameter and a bandwidth of about 1 GHz. Since the modes may have slightly different frequencies, the resulting intensity of the superimposed modes may oscillate with differential (beat) frequencies. These intensity oscillations may be detected by the fast photodiode 220, amplified by the radio frequency (RF) amplifier 190 and delivered to the radio frequency (RF) spectrum analyzer 140. In FIG. 2C, the array of the movable mirrors 250 is disposed along the lateral direction 210 of an output facet of the optical cavity 110 of the broad-area laser diode (BALD) 160. Consequently, using the processor 150 to direct the movements of the array of the movable mirrors 250 suitably, the radio frequency (RF) spectra may be measured for different angular coordinates $\alpha$, producing an angular scan of the radio frequency (RF) spectra of the broad-area laser diode (BALD) 160. Variations of the intensity and phase of each lateral mode field create significant alterations of the radio frequency (RF) spectra, and these variations help significantly enhance the reliability of beat frequency identification and precise measurement of the intensity of the beat frequencies. The radio frequency (RF) spectrum acquisition and analysis may be suitably arranged by the processor 150.

Figure 10A:
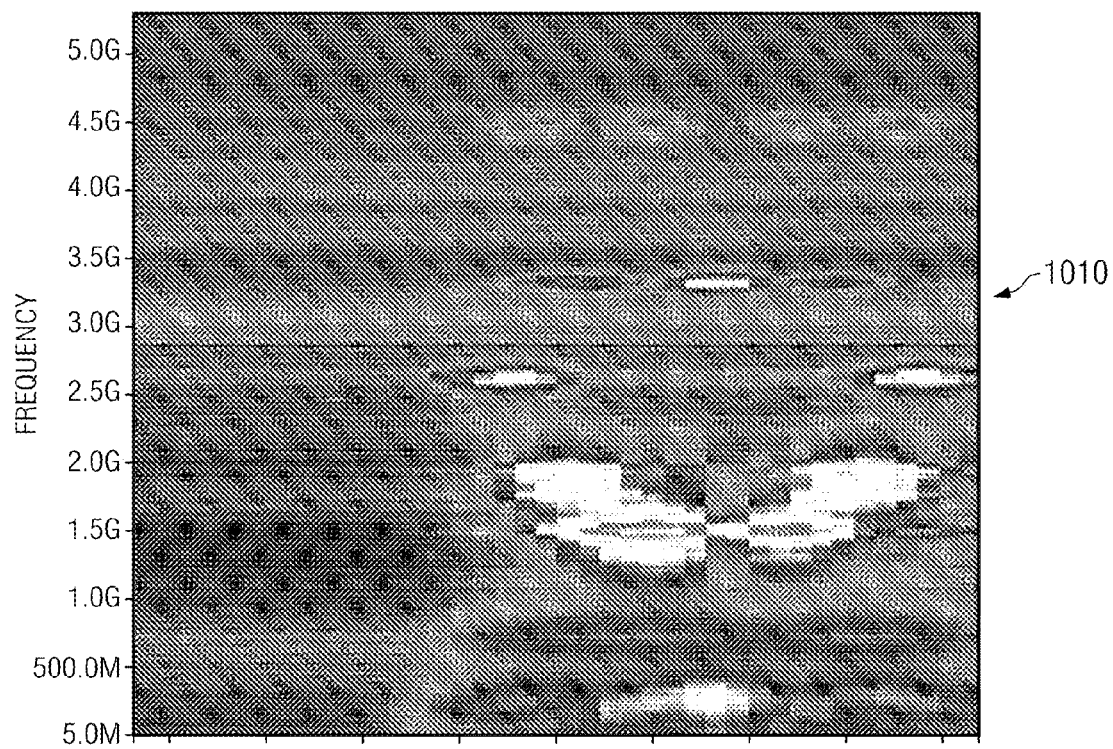
FIG. 10A schematically illustrates results of a radio frequency (RF) spectrum measurement of angularly resolved beat frequencies in accord with the present disclosure.
Figure 10B:
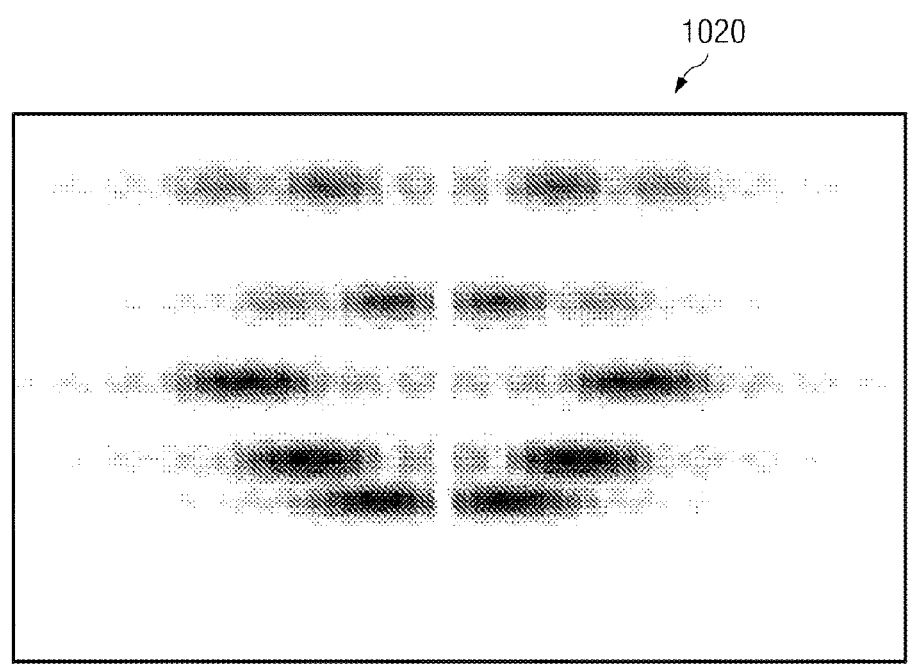
FIG. 10B schematically illustrates results of a radio frequency (RF) spectrum simulation of the angularly resolved beat frequencies for the radio frequency (RF) spectrum shown in FIG. 10A in accord with the present disclosure.

FIG. 10A shows results 1010 of a radio frequency (RF) spectrum measurement of angularly resolved beat frequencies. FIG. 10B shows results 1020 of a radio frequency (RF) spectrum simulation of the angularly resolved beat frequencies for the radio frequency (RF) spectrum shown in FIG. 10A. FIG. 10A shows the measured angularly resolved radio frequency (RF) spectrum of the broad-area laser diode (BALD) 160, having an optical cavity 110 with a longitudinal dimension 510 L=1 mm and a lateral dimension 210 W=100 μm, measured using the pump current of about 300 mA at a temperature T of about 20° C. These results 1010 show that this measurement technique may be capable of measuring beat frequencies from broad-area laser diodes (BALDs) 160 with an angular resolution of about 4 mrad and with a spectral resolution of about 10 MHz to about 50 MHz. The effective bandwidth of the fast photodiode(s) 220 may be about 12 GHz, and the fast photodiode(s) 220 may be operated with a reverse voltage of about 10 Volts.

Figure 10C:
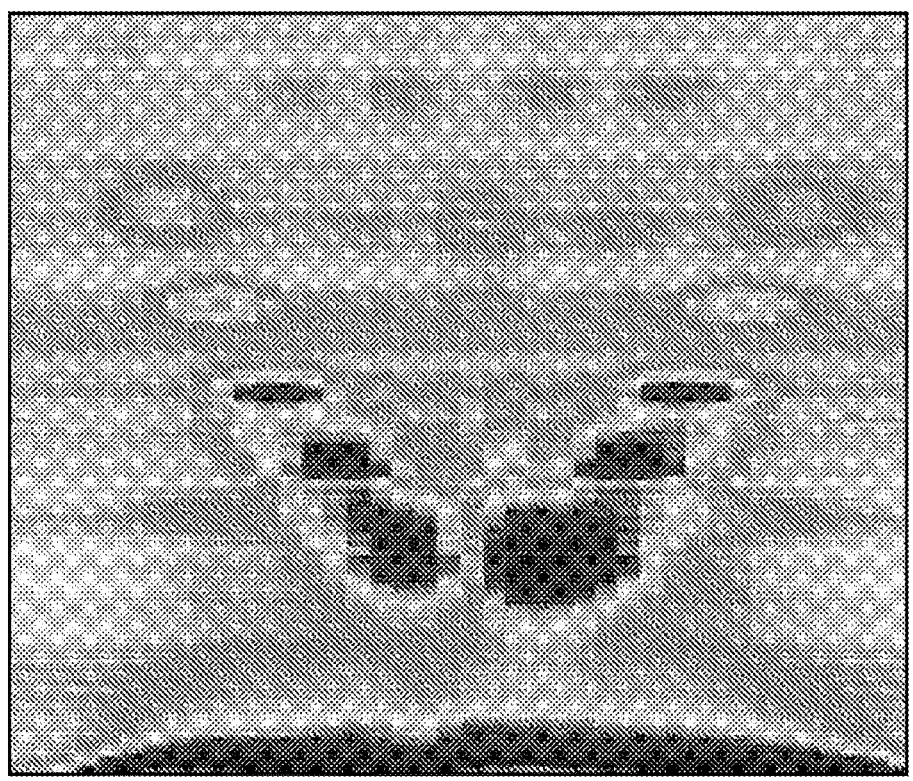
FIG. 10C schematically illustrates results of a radio frequency (RF) spectrum measurement of angularly resolved beat frequencies in accord with the present disclosure.
Figure 10D:
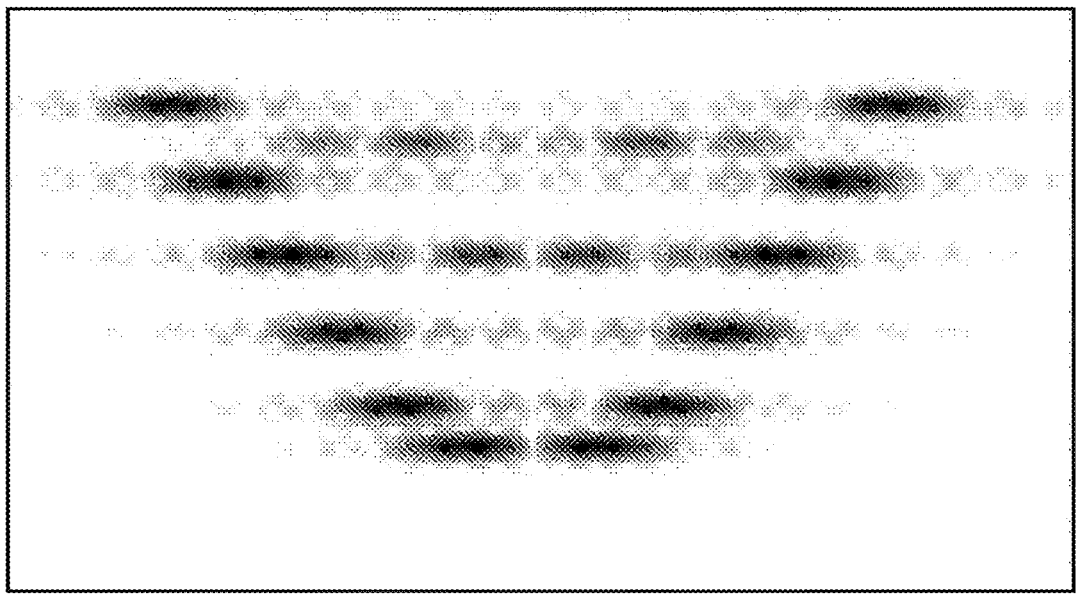
FIG. 10D schematically illustrates results of a radio frequency (RF) spectrum simulation of the angularly resolved beat frequencies for the radio frequency (RF) spectrum shown in FIG. 10C in accord with the present disclosure.

FIG. 10C shows results 1030 of a radio frequency (RF) spectrum measurement of angularly resolved beat frequencies. FIG. 10D shows results 1040 of a radio frequency (RF) spectrum simulation of the angularly resolved beat frequencies for the radio frequency (RF) spectrum shown in FIG. 10C. FIG. 10C shows the measured angularly resolved radio frequency (RF) spectrum of the broad-area laser diode (BALD) 160, having an optical cavity 110 with a longitudinal dimension 510 L=1 mm and a lateral dimension 210 W=100 μm, measured using a moderate pump current level higher than the pump current of about 300 mA at a temperature T of about 20° C. These results 1030 show qualitative agreement with the simplified models described herein, as well as measurable frequency position deviations.

The mode intensity and wavelength recovery process may be done in a similar way as for the near-field measurements as described above and as shown in FIG. 8C, for example. The DC signal information may be needed for the intensity reading, as described above. Measurement of the radio frequency (RF) spectra in the far-field domain 240 may be realized in the case of high lateral mode number and, in various illustrative embodiments, may be a powerful tool for mode position monitoring, detection of coherence spikes, and other non-linear phenomena at high power level.

In various illustrative embodiments, these measurement techniques allow the acquisition of precise information about the lateral mode structure of the broad-area laser diode (BALD) 160 with resolution limited only by the line-width of the laser modes. In various illustrative embodiments, such analysis techniques may be useful for on-chip monitoring of spectral properties of the broad-area laser diode (BALD) 160 without the presence of any external optical elements, as shown in FIG. 4A and FIG. 4B, for example, and as described above. In various illustrative embodiments, such analysis techniques may be useful for advanced, reliability-predictive, laser diode test systems and/or as a high resolution spectrometer for the investigation of non-linear mode interactions in broad-area laser diodes (BALDs) 160.

Figure 11:
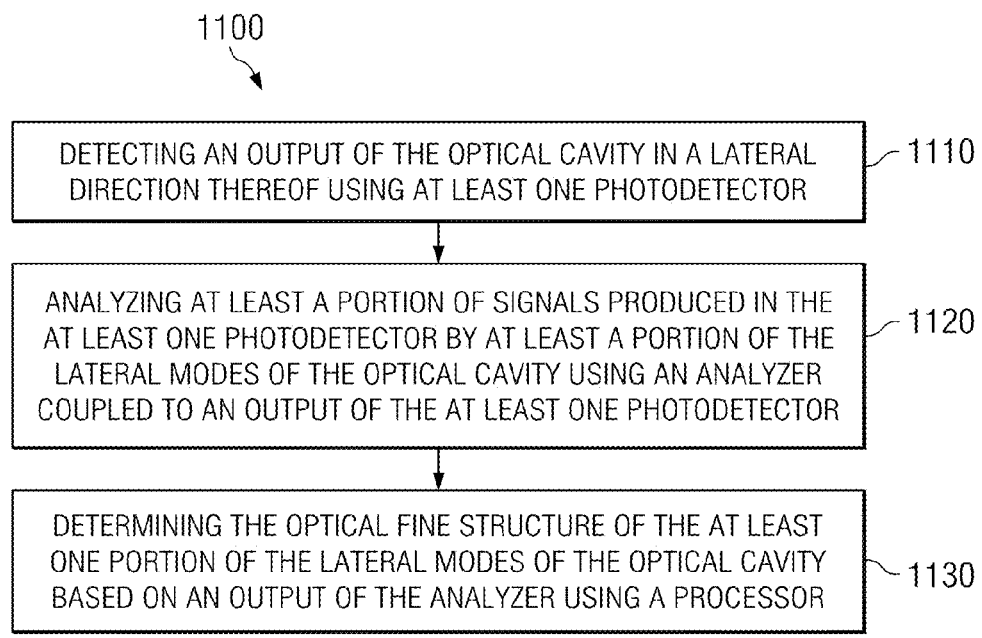
FIG. 11 schematically illustrates a particular example of various illustrative embodiments of a method in accord with the present disclosure.

In various illustrative embodiments, as shown in FIG. 11, for example, a method 1100 for measuring optical fine structure of lateral modes of an optical cavity 110 may comprise detecting an output 130 of the optical cavity 110 in a lateral direction 210 thereof using one or more photodetectors 120, as indicated at 1110. The method 1100 may also comprise analyzing at least a portion of signals produced in the one or more photodetectors 120 by at least a portion of the lateral modes of the optical cavity 110 using an analyzer 140 coupled to an output of the one or more photodetectors 120, as indicated at 1120. The method 1100 may also comprise determining the optical fine structure of at least the portion of the lateral modes of the optical cavity 110 based on an output of the analyzer 140 using a processor 150, as indicated at 1130.

In various illustrative embodiments, spatially-resolved self-heterodyning allows the measurement of the optical fine structure of lateral modes of the broad-area laser diode (BALD) 160. In various illustrative embodiments, the individual lateral mode intensity and wavelength position may be measured using only one or more fast photodetectors 120 and the radio frequency (RF) spectrum analyzer 140. In various illustrative embodiments, the lateral mode structure of the broad-area laser diode (BALD) 160 may be monitored, the coupling reliability to multi-mode fibers may be improved, and/or fluctuations in intensity may be reduced. In various illustrative embodiments, external non-destructive defectoscopy of the active medium may be performed and/or routine prediction of laser degradation may be made. In various illustrative embodiments, spatially-resolved self-heterodyning may deliver additional information about modes, leading to substantially errorless mode identification. In various illustrative embodiments, power monitoring, coupling efficiency monitoring, spectral content monitoring, and/or advanced prediction of reliability through in-situ defect growth monitoring of high-power diode lasers may be provided. In various illustrative embodiments, satellite and submarine communication applications, ladar and lidar applications, medical applications (such as in laser surgery), and/or industrial processing applications (where prediction of failure gives better operational cost and/or power wavelength monitoring gives better machining quality) may be enhanced. In various illustrative embodiments, in-situ laser diode monitoring may be provided through relatively minor modifications of the laser package.

Those of ordinary skill in the art having the benefit of the present disclosure will appreciate that similar results may be obtained from time-domain measurements. For example, time-domain signals corresponding to the radio frequency beat frequencies may be detected using an oscilloscope and the spatially resolved radio frequency spectrum may be determined therefrom using a Fast Fourier Transform (FFT) in a suitable processor and/or co-processor. For example, the RSA6100 Series High Performance Real-Time Spectrum Analyzer made by Tektronix may be used in such embodiments.

In accordance with the present disclosure, an apparatus, system, and method useful for measuring optical fine structure are disclosed. In various aspects, an apparatus in accordance with the present disclosure may comprise means for measuring optical fine structure and means for enabling the means for measuring optical fine structure, both the means for measuring optical fine structure and the means for enabling the means for measuring optical fine structure covering corresponding structures and/or materials described herein and equivalents thereof.

In various other aspects, a system in accordance with the present disclosure may comprise means for measuring optical fine structure, means for enabling the means for measuring optical fine structure, and means for using the means for measuring optical fine structure, all of the means for measuring optical fine structure, the means for enabling the means for measuring optical fine structure, and the means for using the means for measuring optical fine structure covering corresponding structures and/or materials described herein and equivalents thereof. In yet various other aspects, a method in accordance with the present disclosure may comprise steps for measuring optical fine structure and steps for enabling the steps for measuring optical fine structure, both the steps for measuring optical fine structure and the steps for enabling the steps for measuring optical fine structure covering corresponding acts described herein and equivalents thereof.

The particular embodiments disclosed above are illustrative only, as the present claimed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present claimed subject matter. In particular, every range of values (of the form, "from about a to about b," or, equivalently, "from approximately a to b," or, equivalently, "from approximately a-b") disclosed herein is to be understood as referring to the power set (the set of all subsets) of the respective range of values, in the sense of Georg Cantor. Accordingly, the protection sought herein is as set forth in the claims below.

What is claimed is:

1. A device for measuring optical fine structure of lateral modes of an optical cavity, the device comprising:
   at least one photodetector arranged to detect an output of the optical cavity in a lateral direction thereof;
   an analyzer coupled to an output of the at least one photodetector and arranged to analyze at least a portion of signals produced in the at least one photodetector by at least a portion of the lateral modes of the optical cavity; and
   a processor arranged to determine the optical fine structure of the at least the portion of the lateral modes of the optical cavity based on an output of the analyzer.

2. The device of claim 1, wherein the analyzer comprises a radio frequency spectrum analyzer.

3. The device of claim 2, wherein the signals comprise radio frequency beat frequencies.

4. The device of claim 1, wherein the analyzer comprises an oscilloscope.

5. The device of claim 4, wherein the signals comprise time-domain signals corresponding to radio frequency beat frequencies.

6. The device of claim 1, wherein the optical cavity is disposed in a diode.

7. The device of claim 6, wherein the optical cavity is disposed in a broad-area laser diode or a light-emitting diode.

8. The device of claim 1, wherein the at least one photodetector comprises an array of photodiodes.

9. The device of claim 1, wherein the at least one photodetector comprises an array of photodiodes disposed in a near-field domain of the optical cavity.

10. The device of claim 1, wherein the at least one photodetector comprises an array of photodiodes disposed in a far-field domain of the optical cavity.

11. The device of claim 1, wherein the at least one photodetector comprises an array of photodiodes arranged to detect the output of the optical cavity in the lateral direction thereof by radio frequency switching of the array of the photodiodes.

12. The device of claim 1, wherein the at least one photodetector comprises an array of photodiodes arranged to detect the output of the optical cavity in the lateral direction thereof by self-heterodyning the array of the photodiodes.

13. The device of claim 1, wherein the at least one photodetector is arranged to detect the output of the optical cavity in the lateral direction thereof by using an array of movable mirrors.

14. The device of claim 1, wherein the processor is arranged to determine the optical fine structure comprising at least one of wavelength position and lateral mode intensity of the at least the portion of the lateral modes of the optical cavity.

15. A method for measuring optical fine structure of lateral modes of an optical cavity, the method comprising:
   detecting an output of the optical cavity in a lateral direction thereof using at least one photodetector;
   analyzing at least a portion of signals produced in the at least one photodetector by at least a portion of the lateral modes of the optical cavity using an analyzer coupled to an output of the at least one photodetector; and
   determining the optical fine structure of the at least the portion of the lateral modes of the optical cavity based on an output of the analyzer using a processor.

16. The method of claim 15, wherein the analyzer comprises a radio frequency spectrum analyzer.

17. The method of claim 16, wherein the signals comprise radio frequency beat frequencies.

18. The method of claim 15, wherein the analyzer comprises an oscilloscope.

19. The method of claim 18, wherein the signals comprise time-domain signals corresponding to radio frequency beat frequencies.

20. The method of claim 15, wherein the optical cavity is disposed in one of a broad-area laser diode or a light-emitting diode.

21. The method of claim 15, wherein using the at least one photodetector further comprises using an array of photodiodes.

22. The method of claim 15, wherein using the at least one photodetector further comprises using an array of photodiodes disposed in a near-field domain of the optical cavity.

23. The method of claim 15, wherein using the at least one photodetector further comprises using an array of photodiodes disposed in a far-field domain of the optical cavity.

24. The method of claim 15, wherein using the at least one photodetector further comprises using an array of photodiodes and detecting the output of the optical cavity in the lateral direction thereof further comprises radio frequency switching of the array of the photodiodes.

25. The method of claim 15, wherein using the at least one photodetector further comprises using an array of photodiodes and detecting the output of the optical cavity in the lateral direction thereof further comprises self-heterodyning the array of the photodiodes.

26. The method of claim 15, wherein using the at least one photodetector further comprises using an array of movable mirrors.

27. The method of claim 15, wherein determining the optical fine structure of the at least the portion of the lateral modes of the optical cavity further comprises determining at least one of wavelength position and lateral mode intensity of the at least the portion of the lateral modes of the optical cavity.

28. A system for measuring optical fine structure of lateral modes of an optical cavity, the system comprising:
   at least one photodetector on the optical cavity at an end portion thereof, the at least one photodetector arranged to detect an output of the optical cavity in a lateral direction thereof using a first radio frequency switch;
   a radio frequency spectrum analyzer coupled to an output of the at least one photodetector and arranged to analyze at least a portion of radio frequency beat frequencies produced in the at least one photodetector by at least a portion of the lateral modes of the optical cavity; and
   a processor arranged to determine the optical fine structure of the at least the portion of the lateral modes of the optical cavity based on an output of the radio frequency spectrum analyzer and to provide mode-stabilization retroactive feedback to the at least one photodetector using a second radio frequency switch.

29. The system of claim 28, wherein the at least one photodetector comprises an array of isolated contacts comprising saturable absorbers laterally disposed on the optical cavity at an end portion thereof.

* * * * *